United States Patent
Grandclerc et al.

(10) Patent No.: US 11,275,238 B2
(45) Date of Patent: Mar. 15, 2022

(54) ACTIVE SCREEN AND HEAD-UP DISPLAY COMPRISING SUCH A SCREEN

(71) Applicant: VALEO COMFORT AND DRIVING ASSISTANCE, Créteil (FR)

(72) Inventors: François Grandclerc, Créteil (FR); Pierre Mermillod, Créteil (FR)

(73) Assignee: VALEO COMFORT AND DRIVING ASSISTANCE, Créteil (FR)

( * ) Notice: Subject to any disclaimer, the term of this patent is extended or adjusted under 35 U.S.C. 154(b) by 310 days.

(21) Appl. No.: 16/083,734

(22) PCT Filed: Mar. 10, 2017

(86) PCT No.: PCT/EP2017/055753
§ 371 (c)(1),
(2) Date: Feb. 5, 2019

(87) PCT Pub. No.: WO2017/153600
PCT Pub. Date: Sep. 14, 2017

(65) Prior Publication Data
US 2019/0155025 A1    May 23, 2019

(30) Foreign Application Priority Data

Mar. 11, 2016 (FR) ........................................ 1600410

(51) Int. Cl.
*G02B 27/01* (2006.01)
*H01L 25/075* (2006.01)
(Continued)

(52) U.S. Cl.
CPC ......... *G02B 27/0101* (2013.01); *G02B 27/01* (2013.01); *H01L 25/0753* (2013.01);
(Continued)

(58) Field of Classification Search
CPC ................ G02B 27/0101; G02B 27/01; G02B 2027/0118; H01L 25/0753; H01L 27/1214;
(Continued)

(56) References Cited

U.S. PATENT DOCUMENTS 7,332,746 B1    2/2008    Takahashi et al.
8,350,251 B1 *  1/2013    Lowgren ................. H01L 33/46
                                                            257/13
(Continued)

FOREIGN PATENT DOCUMENTS

EP    2665100 A2    11/2013
FR    3011388 A1    4/2015
(Continued)

OTHER PUBLICATIONS

International Search Report issued in International Application No. PCT/EP1017/055753 dated Apr. 7, 2017 (3 pages).
(Continued)

*Primary Examiner* — Collin X Beatty
(74) *Attorney, Agent, or Firm* — Osha Bergman Watanabe & Burton LLP

(57) ABSTRACT

The invention relates to an active screen (220), i.e. to a light-emitting screen, comprising a matrix array of modules (222) that each form one pixel, and a matrix array (260) of control elements that are intended to address each of these modules, respectively. According to the invention, each module comprises at least three light-emitting submodules (224) that each include a three-dimensional light-emitting structure (250), and each control element is intended to individually address each submodule. A head-up display (1) comprising such a screen (220), and a device (24) for projecting images, said device being suitable for transmit-
(Continued)

ting, in the direction of a semitransparent mirror (10) the images generated by said screen, is also described.

13 Claims, 2 Drawing Sheets

(51) Int. Cl.
   *H01L 33/08* (2010.01)
   *H01L 33/24* (2010.01)
   *H01L 33/18* (2010.01)
   *H01L 27/12* (2006.01)
   *H01L 33/50* (2010.01)
   *B60K 35/00* (2006.01)

(52) U.S. Cl.
   CPC .......... *H01L 27/1214* (2013.01); *H01L 33/08* (2013.01); *H01L 33/18* (2013.01); *H01L 33/24* (2013.01); *H01L 33/502* (2013.01); *B60K 35/00* (2013.01); *B60K 2370/334* (2019.05); *G02B 2027/0118* (2013.01); *H01L 33/50* (2013.01)

(58) Field of Classification Search
   CPC ......... H01L 33/08; H01L 33/18; H01L 33/24; H01L 33/50; H01L 33/502; B60K 2370/334; B60K 35/00
   USPC .......................................... 359/630
   See application file for complete search history.

(56) References Cited

U.S. PATENT DOCUMENTS

| | | | | |
|---|---|---|---|---|
| 10,062,818 | B2* | 8/2018 | Dupont | H01L 33/20 |
| 10,100,997 | B2* | 10/2018 | Albou | B60Q 1/2607 |
| 10,347,791 | B2* | 7/2019 | Kim | H01L 33/08 |
| 10,535,709 | B2* | 1/2020 | Hugon | H01L 33/0075 |
| 10,714,337 | B2* | 7/2020 | Kim | H01L 21/02639 |
| 2006/0175601 | A1* | 8/2006 | Lieber | H01L 31/0352 257/19 |
| 2008/0149914 | A1* | 6/2008 | Samuelson | H01L 21/02521 257/9 |
| 2011/0254034 | A1 | 10/2011 | Konsek et al. | |
| 2012/0056237 | A1* | 3/2012 | Choi | H01L 21/02422 257/103 |
| 2012/0223289 | A1* | 9/2012 | Gwo | H01L 33/18 257/13 |
| 2013/0190971 | A1* | 7/2013 | Anderson | F21S 41/663 701/36 |
| 2014/0124802 | A1 | 5/2014 | Do et al. | |
| 2014/0166974 | A1* | 6/2014 | Yoo | H01L 33/08 257/13 |
| 2015/0228634 | A1* | 8/2015 | Schug | H01L 25/167 257/88 |
| 2016/0025973 | A1 | 1/2016 | Guttag et al. | |
| 2016/0025976 | A1 | 1/2016 | Ogawa et al. | |
| 2016/0087150 | A1* | 3/2016 | Ristic | H01S 5/405 372/44.01 |

FOREIGN PATENT DOCUMENTS

| | | |
|---|---|---|
| FR | 3019380 A1 | 10/2015 |
| WO | 2008129859 A1 | 10/2008 |

OTHER PUBLICATIONS

Written Opinion issued in International Application No. PCT/EP1017/055753 dated Apr. 7, 2017 (3 pages).

* cited by examiner

ACTIVE SCREEN AND HEAD-UP DISPLAY COMPRISING SUCH A SCREEN

TECHNICAL FIELD TO WHICH THE INVENTION RELATES

The present invention generally relates to the field of screens.

It more particularly relates to a screen comprising a matrix array of modules each forming a pixel, and a matrix array of control elements that are intended to address each of these modules, respectively.

It also relates to a head-up display comprising such a screen by way of image-generating device.

TECHNOLOGICAL BACKGROUND

The principle of automotive head-up displays is to project images, in particular images that are useful for driving, directly into the field of view of a driver.

Such head-up displays comprise an image-generating device that is suitable for generating images toward an image-projecting device that transmits them in the direction of a combiner or a windshield placed in the field of view of a driver.

Image-generating devices that comprise a screen formed from pixels that are backlit by light sources in order to form an image in the direction of the projecting device are known. In general, in these image-generating devices, a reflector and a diffuser are provided to increase the uniformity of and to maximize the light received by the screen.

Image-generating devices that comprise a diffuser, an entrance face of which is scanned by a light beam in order to form an image that is output from said diffuser, are also known. The light beam that scans the entrance face of the diffuser is, in this case, generated by a scanning unit.

The screen and the diffuser are passive elements that need to be backlit. The optical efficacy of these image-generating devices is mediocre since most of the light beams generated for the backlighting are lost, and at the present time this loss is mainly compensated for by increasing the power of the generated light beams.

Furthermore, the backlighting or scanning units are voluminous and participate in the bulk of the head-up display in the vehicle.

SUBJECT OF THE INVENTION

In order to remedy the aforementioned drawbacks of the prior art, the present invention proposes an active screen that generates images itself.

More precisely, the present invention proposes a screen comprising three-dimensional light-emitting electroluminescent structures.

More particularly, according to the invention a screen is proposed comprising a matrix array of modules each forming a pixel, and a matrix array of control elements that are intended to address each of these modules, respectively, wherein each module comprises at least three light-emitting submodules each including a three-dimensional electroluminescent structure, and wherein each control element is intended to individually address each submodule.

Thus, advantageously, the luminous efficacy of the screen is improved because it is itself the light source. In other words, by virtue of the invention, the screen is no longer a transmitter of light but an emitter of light.

Furthermore, the luminous efficacy of the pixels of the screen is improved, by virtue of the three-dimensional aspect of the electroluminescent structures.

Furthermore, the spatial bulk of such a screen is greatly decreased because it does not require a backlighting device.

The following are other nonlimiting and advantageous features of the screen according to the invention:

- within each module, at least one first submodule is able to emit light in the interval of the visible spectrum extending between 380 nm and 500 nm, at least one second submodule is suitable for emitting light in the interval of the visible spectrum extending between 500 nm and 580 nm, and at least one third submodule is suitable for emitting light in the interval of the visible spectrum extending between 610 nm and 700 nm;
- at least 40% of the modules comprise an additional submodule suitable for omitting white light in the interval of the visible spectrum extending between 380 nm and 700 nm;
- at least one three-dimensional electroluminescent structure comprises a plurality of three-dimensional electroluminescent microstructures (connected in parallel to one another);
- each three-dimensional electroluminescent structure comprises at least 100 three-dimensional electroluminescent microstructures;
- each three-dimensional electroluminescent microstructure comprises a cylindrical emitting junction;
- each three-dimensional light-emitting structure is covered with an active crystallographic layer suitable for emitting light;
- the three-dimensional electroluminescent structure of certain submodules is covered with a luminophore;
- the luminophores are phosphors;
- each control element of said matrix array of control elements comprises at least one transistor; and
- each three-dimensional electroluminescent structure is based on semiconductors and comprises a relatively planar substrate from which rise wires.

The invention also proposes a head-up display comprising a screen such as described above (thus forming an image-generating device), and an image-projecting device that is suitable tor transmitting, in the direction of a semitransparent plate, the images generated by said screen.

This semitransparent plate is for example a combiner (for example located between a windshield of the vehicle and the driver), or, as a variant, the windshield, of the vehicle.

The image-projecting device may in practice comprise a mirror (folding mirror) that is arranged so as to reflect, in the direction of the semitransparent plate, the images generated by the screen.

DETAILED DESCRIPTION OF THE EMBODIMENT

The following description, which is given with reference to the appended drawings, which are given by way of nonlimiting example, will allow of what the invention consists and how it may be carried out to be clearly understood.

In the appended drawings:

FIG. 2 is a schematic representation of an active screen according to the invention, seen front-on;

In the rest of the description, the side of the screen that is turned toward the projecting device, in position in the head-up display, will be referred to as the "front". In other words, the "front" is the side of the screen that emits light.

The side of the screen opposite the front side will be referred to as the "back".

Figure 1:
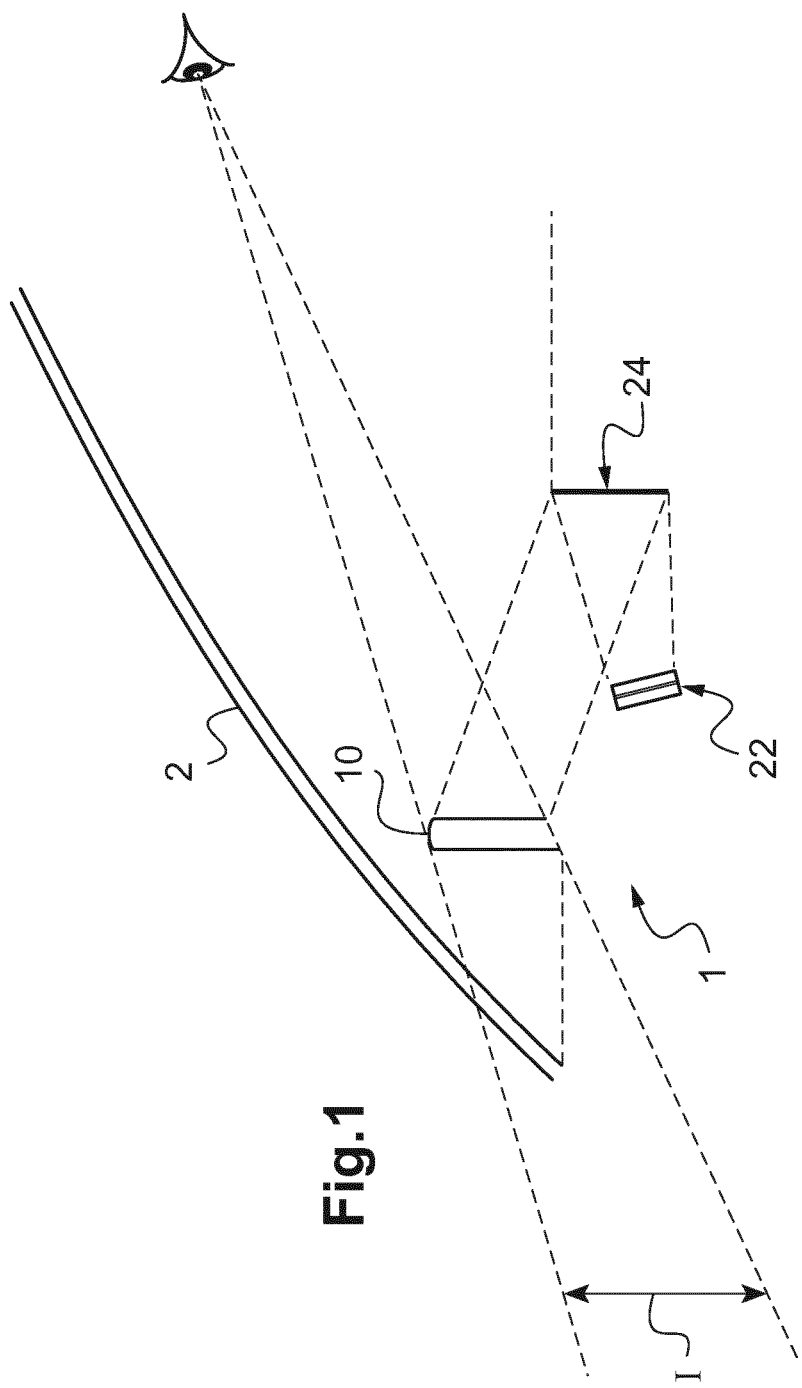
FIG. 1 is a schematic conceptual representation of a head-up display according to the invention in position in a vehicle.

FIG. 1 shows the main elements of a head-up display 1 with which a vehicle, for example a motor vehicle, is intended to be equipped.

Such a display 1 is suitable for creating a virtual image I in the field f view of a driver of the vehicle, so that the driver is able to see this virtual image I and any information that it contains without having to divert his gaze.

To this end, the display 1 comprises an image-generating device 22 that is suitable for generating an image, and an image-projecting device 24 that is suitable for transmitting this image in the direction of a semitransparent plate 10 placed in the field of view of the driver (see FIG. 1).

More precisely, in this example embodiment of the head-up display 1, the semi-transparent plate 10 is a combiner 10 (i.e. a semitransparent plate dedicated to the head-up display).

Such a combiner 10 is here placed between the windshield 2 of the vehicle and the eyes of the driver.

As a variant, the semitransparent plate could be the windshield 2 of the vehicle. In other words, in this variant, it is the windshield 2 of the vehicle that has the semitransparent-plate function for the head-up display.

Moreover, here, the image-projecting device 24 comprises a folding mirror arranged so as to reflect the images generated by the image-generating device 22 in the direction of the semitransparent plate 10. Here, the folding mirror is a plane mirror.

As a variant, the image-projecting device could comprise a plurality of mirrors and/or other optical elements such as a lens for example.

The image-generating device 22 is formed by an active screen 220, i.e. a light-emitting screen.

Advantageously, this screen 220 does not need to be backlit. Thus, the image-generating device 22 described here does not comprise a system allowing the screen 220 to be lit from the back, as is the case for passive screens.

The screen 220 comprises, at the front, a matrix array of modules 222 each forming a pixel of said screen, and, at the back, a matrix array 260 of control elements that are intended to address each of these modules 222, respectively.

Figure 2:
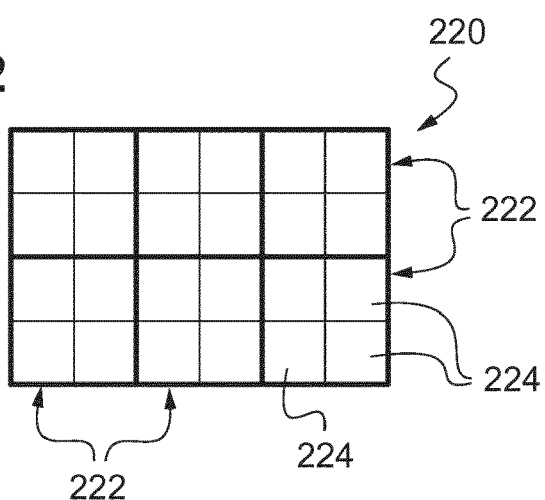

In other words, the screen is divided into modules 222, each module 222 forming a pixel of said screen 220 (FIG. 2).

Each module 222 of said screen 220 is itself subdivided into a least three submodules 224 that form subpixels of the screen 220.

Figure 3:
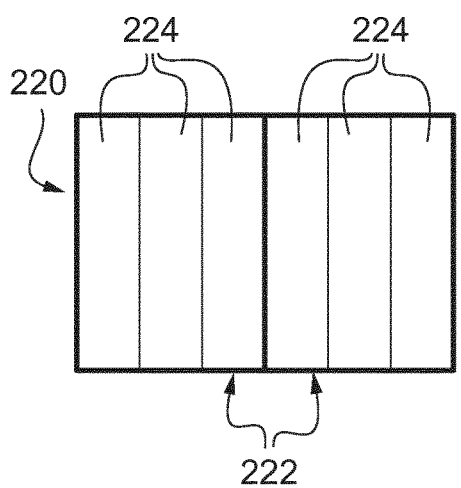
FIG. 3 is a schematic representation of a variant embodiment of a module comprised in the active screen of FIG. 2.

Here, each module 222 may comprise three (FIG. 3) or four (FIG. 2) submodules 224.

As a variant, each module could comprise more than four submodules.

The submodules 224 may have various shapes.

They may in particular be of rectangular shape, seen from in front of the screen 220, so that assembled three by three (FIG. 3), or four by four, they form a module 222 of square shape.

Here, seen from in front of the screen 220, each submodule 224 measures about 28.4 µm by 85.2 µm. Each submodule 224 then has, in the front plane of the screen, an area of about 2420 µm².

Thus, each module 222 comprising three of these rectangular submodules 224 has, in the plane of the screen, an area of about 7260 µm².

As a variant, the submodules could conceivably have a square shape (FIG. 2) as seen from in front of the screen so that, assembled four by four, they form a module 222 that is also of square shape.

Each submodule 224 is a light emitter and includes, to this end, a three-dimensional electroluminescent structure 250.

In practice, each three-dimensional electroluminescent structure 250 is suitable for converting an electrical signal into light radiation.

Figure 4:
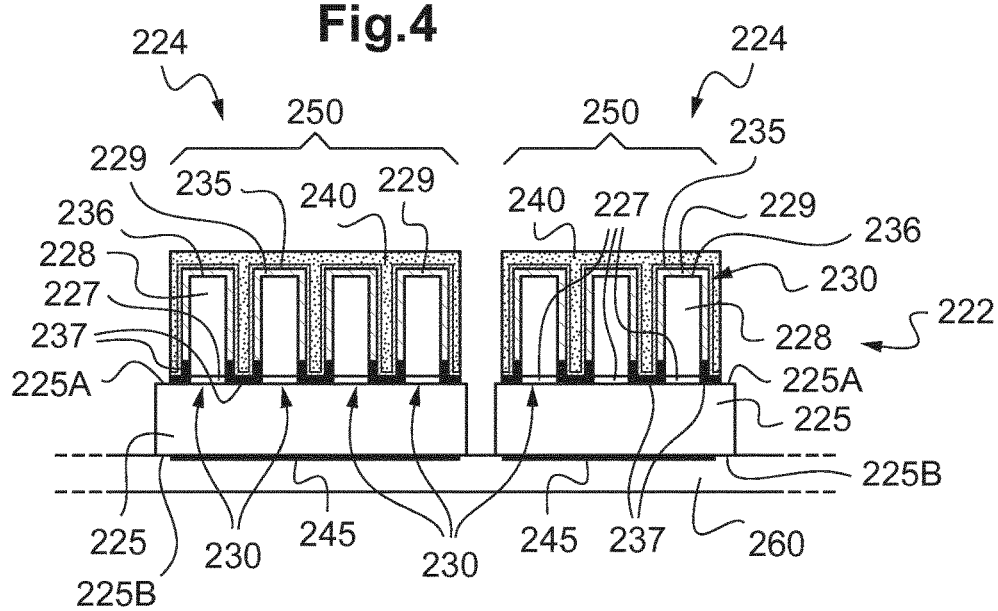
FIG. 4 is a schematic profile representation of the active screen of FIG. 2.

To do this, as FIG. 4 shows, each three-dimensional electroluminescent structure 250 comprises:
  a semiconductor substrate 225 a front face 225A of which is planar,
  seeding blocks 227 that are placed on this front face 225A,
  wires 228, each wire 228 making contact with a seeding block 227,
  shells 229 comprising a stack of semiconductor layers covering each wire 228 at least partially,
  a layer forming an electrode 235 covering each shell 229 and extending over the front face 225A of the substrate but separated therefrom by an insulating layer 237, and
  a conductive pad 245 that is placed on a back face 225B of the substrate 225 plumb with the wires 228.

The semiconductor substrate 225 is generally made of a single-crystal silicon, but may be made of other semiconductors such as germanium or silicon carbide for example.

The semiconductor substrate 225 of each three-dimensional electroluminescent structure 250 lies on the whole in the plane forming said screen 220.

It measures about 28.4 µm by 85.2 µm, as seen from in front of the screen 220. Its thickness is here smaller than 1500 µm.

This substrate 225 may be doped (p- or n-type depending on the need) so as to decrease its electrical resistivity so that it reaches that of metals (a few mohm·cm).

The seeding blocks 227 are made of a material that promotes the growth of the wires 228.

The seeding blocks 227 may be doped the same conductivity type (p- or n-type) as the substrate 225.

Furthermore, a treatment suitable for protecting the flanks of the seeding blocks 227 and the portions of the substrate 225 that are not covered by the seeding blocks 227 may optionally be provided so as to prevent growth of the wires 228 on these treated surfaces. This treatment may consist in creating dielectric regions for example.

The wires 228 mainly extend in a direction of extension that is on the whole perpendicular to the plane of the substrate 225.

They have an overall cylindrical shape and have a cross section in the plane of the substrate 225 that may be of various shapes, for example hexagonal, square, or more generally polygonal.

The axes of extension of two adjacent wires are distant by 0.5 µm to 10 µm. They may for example be regularly distributed in a hexagonal network.

They are at least partially formed by at least one semiconductor such as silicon, germanium, silicon carbide or a combination of these compounds.

Just like the substrate 225 and the seeding blocks 227, they may also be doped (p- or n-type).

The shells 229 for their part comprise various layers of material, including an active layer directly covering each wire 228.

The active layer is a crystallographic layer that is equipped with quantum wells and that is capable of emitting light when it is stimulated. It is from this active layer that moat of the light is emitted by the three-dimensional electroluminescent structure 215.

Advantageously, the active layer of each shell 229 forms an individual envelope around each wire the active layer of each shell 229 is closed on itself.

It is clear from the above that each three-dimensional electroluminescent structure 250 in practice includes at least on three-dimensional electroluminescent microstructure 230 comprising a wire semiconductor element (see FIG. 4).

More precisely, each microstructure 230 comprises a seeding block 227, a wire 228 and a shell 229. Such microstructures 230 are known and a method for obtaining them is described in, more detail in document FR3011388 for example.

Here, each three-dimensional electroluminescent structure 250 includes a plurality of these microstructures 230, or even several hundred of these microstructures 230.

The microstructures 230 of each three-dimensional electroluminescent structure 250 are here connected in parallel to one another. Furthermore, in practice, the microstructures 230 of a given three-dimensional electroluminescent structure 250 are separated from one another by the insulating layer 237.

The average diameter of each microstructure 230 is for example smaller than 2.5 µm, so that, to achieve the dimension desired for each submodule 224, each three-dimensional electroluminescent structure 250 for example includes between one hundred and one thousand microstructures 230. By "average diameter", what is meant is the diameter associated with the disc having the same area as the cross section of the microstructure 230 in question.

Advantageously, by virtue of the three-dimensional electroluminescent structures 250, the screen 220 according to the invention may be of small size while offering a sufficient brightness for each subpixel, and therefore for each pixel.

The height of each microstructure 230, i.e. the dimension of the microstructure 230 in the direction of extension of its wire 228, is chosen to be at least equal to the average diameter of the microstructure 230, but preferably to be at least 10 times larger than said average diameter.

The substrate 225 and the microstructures 230 forming protrusions on the front face of said substrate 225, form the three-dimensional structure of each three-dimensional electroluminescent structure 250. This three-dimensional structure is very different from conventional two-dimensional electroluminescent structures formed by a stack of layers of materials.

Advantageously, each microstructure 230 comprises a semiconductor and quantum well, and each microstructure 230 is therefore capable of converting an electrical signal into light radiation. Thus, the total area from which light radiation may be emitted corresponds to the cumulative area of all of the microstructures 230, namely the cumulative area of each perimeter and of each cross section of each microstructure 230.

Figure 5:
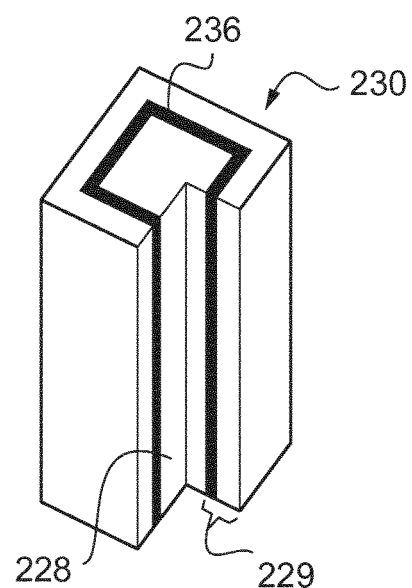
FIG. 5 is a schematic representation of a three-dimensional electroluminescent microstructure comprised in the active screen of FIG. 4.

Specifically, by virtue of the construction described above and as schematically shown in FIG. 5, each microstructure 230 comprises a three-dimensional junction 236 (where the light-emitting quantum wells are formed), here of cylindrical general shape with a cylinder axis extending in the general, direction of extension of the wires 228.

Here, the junction 236 is comprised in the shell 229 of each microstructure 230. Thus, for each microstructure 230, the light-emitting junction 236 extends both over the entire height and over the entire periphery of the wire 228, this ensuring the aforementioned high efficacy.

Moreover the electrode 235 covering the microstructures 230 of each three-dimensional electroluminescent structure 230 is suitable for biasing the active layer covering each wire 250 and for letting pass the electromagnetic radiation emitted by the microstructures 230.

The conductive pad 245 is for its part suitable for making an electrical signal pass through the corresponding three-dimensional electroluminescent structure 250.

Lastly, each three-dimensional electroluminescent structure 250 of each submodule 224 is covered with an encapsulating layer 210 (see FIG. 4).

This encapsulating layer 240 is made of an insulating and at least partially transparent material.

It is suitable for projecting the microstructures 230 and the electrode 235 that are comprised in each three-dimensional electroluminescent structure 250.

Generally, within each module 222, at least one first submodule 222 is suitable for emitting light in the interval of the visible spectrum, extending between 380 nm and 500 nm, i.e. in the blue, at least one second submodule 224 is suitable for emitting light in the interval of the visible spectrum extending between 500 nm and 580 nm, i.e. in the green, and at least one third submodule 224 is suitable for emitting light in the interval of the visible spectrum extending between 610 nm and 700 nm, i.e. in the red.

In practice, these first, second and third submodules 224 are placed in succession beside one another as seen from in front of the screen (see FIG. 2).

It is also possible to add, to certain of the modules 222, an additional submodule 224 that emits in all the visible spectrum, i.e. that emits a white light composed of light radiation of wavelengths lying between about 380 nm and 700 nm.

Thus, two successive modules 222 are either two modules 222 comprising a succession of "red-green-blue" submodules 224, or two, modules 222 comprising a succession of "red-green-blue-white" submodules 224, or a module 222 comprising a succession of "red-green-blue" submodules 224 followed by a module 222 comprising a succession of "red-green-blue-white" submodules 224.

In order that each submodule 224 emit light, it is possible to envision, according to a first embodiment, that the three-dimensional electroluminescent structure 250 of each submodule 224 itself be suitable for emitting light radiation, and, according to a second embodiment, that certain three-dimensional electroluminescent structures 250 furthermore be covered with a layer of luminophores that emit light radiation.

Thus, whatever the envisioned embodiment, on the basis of three submodules 224, each module 222 is capable of emitting a multitude of different colors.

Advantageously, the white light emitting additional submodule 224 allows the light intensity emitted by the pixel formed by the module 222 comprising this additional submodule 224 to be more easily modulated.

In practice, the first, second and third submodules 224 each emit a precise wavelength.

However, it is also possible to envision the first, second and third submodules each emitting in a narrow wavelength interval, i.e. in a continuous range extending over a few tens of nanometers, for example over 50 nm or more.

According to the first embodiment, the active layers of the shells 229 of the microstructures 230 forming each three-dimensional electroluminescent structure 250 of the first, second and third submodules 224 are designed so as to be able to emit light in the interval of the useful visible spectrum.

In other words, the active layer of the shell 229 of the microstructures 230 of each three-dimensional electroluminescent structure 250 of the first, second and third submodules 224 is a crystallographic layer suitable for emitting light.

In particular, the active layer of the shell 229 of the microstructures 230 of the first three-dimensional electroluminescent structure 250 is suitable for emitting in the blue, the active layer of the shell 229 of the microstructures 230 of the second three-dimensional electroluminescent structure 250 is suitable for emitting in the green, the active layer of the shell 229 of the microstructures 230 of the third three-dimensional electroluminescent structure 250 is suitable for emitting in the red.

To achieve this, it is possible to adapt the thickness or the compositions of the quantum wells forming these active layers.

In other words, the crystallographic structure of the active layer of each shell 229 may be adapted so that said active layer emits at a chosen wavelength.

According to the second embodiment, all the active layers of the shells 229 of the microstructures 230 forming each three-dimensional electroluminescent structure 250 of the first, second and third submodules 224 are designed so as to be able to emit monochromatic light, here in the blue.

According to the second embodiment, the three-dimensional electroluminescent Structure 250 of certain submodules 224 is covered with a layer of luminophores so as to emit light in the red or in the green.

Here the layer of luminophores is merged with the encapsulating layer 240.

As a variant, the layer of luminophores could be placed above the encapsulating layer.

In particular, the luminophores may be first phosphors suitable for emitting green light when stimulated by at least one wavelength of the interval of the visible spectrum extending between 380 nm and 500 nm (blue), and second phosphors suitable for emitting red light when stimulated by at least one wavelength of the interval of the visible spectrum extending between 380 nm and 500 nm (blue).

It is then possible to cover the three-dimensional electroluminescent structure of the second submodule 224 with a layer of first phosphors jo that it emits green light, and to cover the three-dimensional electroluminescent structure or the third submodule 224 with a layer of second phosphors so that it emits red light.

Advantageously, the phosphors cover most of the area of the second and third submodules 224. For example, the phosphors cover more than 80% of the total area of the submodules 224 to which they belong.

Thus, the use of luminophores to obtain light radiation of desired color allows a uniform light to be obtained over the entire area of the submodule 224 in question.

Moreover, here, at least 40% of the modules 222 comprise an additional submodule that is suitable for emitting white light.

In practice, such an additional submodule for example comprises three three-dimensional electroluminescent structures: a first capable of emitting light radiation in the blue, a second capable of emitting in the green, and a third capable of emitting in the red, these three three-dimensional electroluminescent structures being connected in series with one another. Thus, the additional submodule is capable of simultaneously emitting a blue light, a green light and a red light, this being equivalent to the emission of a white light. Such an additional submodule is more particularly described in document FR3011388.

As a variant, the additional submodule could comprise a single three-dimensional electroluminescent structure capable of emitting blue light, covered with a layer of various luminophores suitable for emitting red light and green light when they are stimulated by a wavelength of the visible spectrum lying between 380 nm and 500 nm (blue), respectively. Thus, this additional submodule would emit light rays in the green and in the red, and a few light rays in the blue (those that did not meet luminophores on passing through the layer of luminophores). The overall light radiation emitted by this additional submodule would be perceived as being white light.

As another variant, the additional submodule could comprise a single three-dimensional electroluminescent structure capable of emitting blue light, covered with a layer of luminophores capable of emitting light in the interval of the visible spectrum extending between 580 nm and 600 nm, i.e. in the yellow, when they are stimulated by a wavelength of the visible spectrum lying between 380 nm and 500 nm (blue). Thus, this additional submodule would emit light rays in the yellow and a few light rays in the blue, this being equivalent to an emission of white light.

It would also be envisionable for the submodules to emit in wavelength intervals ether than those associated with the colors blue, green, red and white.

Moreover, advantageously, the three-dimensional electroluminescent microstructures 230 emit light in every direction.

In order to take the fullest possible advantage of the light emissions, the front face 225A, of the substrate 225, which face is located between the microstructures 230, is here covered with a mirror (not shown) that reflects the light rays frontward.

The submodules 224 described here are individual submodules arranged beside one another so as to form each module 222, and thus the matrix array of modules 222 of the screen 220.

Each submodule 224 is individually addressed, from the back, by virtue of a control element.

Here, each control element comprises at least one transistor.

More precisely, here, each control element comprises three, or even four, transistors, each transistor being electronically connected to a submodule 224 via the conductive pad 245 associated with this submodule 224.

The matrix array or modules 222, which is formed by assembling submodules 224, is added to the matrix array 260 of control elements that each transistor controls the voltage applied to and/or the current injected into a corresponding three-dimensional electroluminescent structure 250.

As a variant, the matrix array of control elements could be integrated into the substrate comprised in the matrix array of modules.

Thus, analogously to what is the case in thin-film transistor (TFT) screens, the modules 222 and submodules 224 of the screen 220 are addressed individually by control elements that are also arranged in the form of a matrix array 260.

The active screen 220 thus formed has a free form factor. Specifically, the screen 220 may adopt any chosen form, this may be achieved simply by suitably arranging the submodules 224 and/or the modules 222.

This is particularly advantageous in the case of screens for head-up displays since there is a distortion of the images that is intrinsic to the operation of said head-up displays that may be compensated for by virtue of the form of the image-generating screens.

In addition, advantageously, by virtue of the three-dimensional electroluminescent structures 250, the screen 220 is of small size, while nonetheless offering a satisfactory brightness for each pixel.

Furthermore, advantageously, the use of three-dimensional electroluminescent structures 250 decreases the heat generated by the image-generating device. It is then not necessary to use a heat-dissipating radiator and the bulk of the head-up display according to the invention is thus decreased.

Advantageously, since the active screen thus formed does not need to be backlit, the optical efficiency of the head-up display is clearly improved, and its bulk is further decreased.

Moreover, the invention allows a notable economic saving to be made, the three-dimensional electroluminescent structures used being inexpensive and requiring little power to emit light.

The invention claimed is:

1. A screen comprising:
a matrix array of modules each forming a pixel; and
a matrix array of control elements that controls each of the modules, respectively, wherein:
each module comprises at least three light-emitting submodules that each includes a three-dimensional electroluminescent structure,
the matrix array of control elements includes a plurality of transistors,
each of the submodules is individually connected to and controlled by a separate and distinct one of a transistor among the plurality of transistors,
at least 40% of the modules comprise an additional submodule comprising three of the three-dimensional electroluminescent structures connected in series with one other to emit white light in the interval of the visible spectrum extending between 380 nm and 700 nm, and
within each of the at least 40% of the modules
the at least three light-emitting submodules collectively form a first red-green-blue submodule for selectively emitting light in different visible spectrum intervals,
the additional submodule forms a second red-green-blue submodule for simultaneously emitting light in the different visible spectrum intervals, and
the single pixel is formed by the first red-green-blue submodule and the second red-green-blue submodule.

2. The screen as claimed in claim 1, wherein, within each module, at least one first submodule emits light in the interval of the visible spectrum extending between 380 nm and 500 nm, at least one second submodule emits light in the interval of the visible spectrum extending between 500 nm and 580 nm, and at least one third submodule emits light in the interval of the visible spectrum extending between 610 nm and 700 nm.

3. The screen as claimed in claim 1, wherein at least one three-dimensional electroluminescent structure comprises a plurality of three-dimensional electroluminescent microstructures.

4. The screen as claimed in claim 3, wherein each three-dimensional electroluminescent structure comprises at least 100 three-dimensional electroluminescent microstructures.

5. The screen as claimed in claim 3, wherein each three-dimensional electroluminescent microstructure comprises a cylindrical emitting junction.

6. The screen as claimed in claim 1, wherein each three-dimensional light-emitting structure is covered with an active crystallographic layer suitable for emitting light.

7. The screen as claimed in claim 1, wherein the three-dimensional electroluminescent structure of certain submodules is covered with a luminophore.

8. The screen as claimed in claim 7, wherein the luminophores are phosphors.

9. The screen as claimed in claim 1, wherein each three-dimensional electroluminescent structure is based on semiconductors and comprises a substrate from which rise wires.

10. A head-up display comprising a screen as claimed in claim 1; and an image-projecting device for transmitting, in the direction of a semitransparent plate, the images generated by said screen.

11. The head-up display as claimed in claim 10, wherein the semitransparent plate is a combiner.

12. The head-up display as claimed in claim 10, wherein the semitransparent plate is a windshield.

13. The head-up display as claimed in claim 10, wherein the image-projecting device comprises a mirror that is arranged so as to reflect, in the direction of the semitransparent plate, the images generated by the screen.

* * * * *